(12) United States Patent
Tiwari et al.

(10) Patent No.: US 12,494,773 B2
(45) Date of Patent: *Dec. 9, 2025

(54) SCHMITT TRIGGER WITH PULL-UP TRANSISTOR

(71) Applicant: STMicroelectronics International N.V., Geneva (CH)

(72) Inventors: Manoj Kumar Tiwari, Unnao (IN); Saiyid Mohammad Irshad Rizvi, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/443,112

(22) Filed: Feb. 15, 2024

(65) Prior Publication Data

US 2024/0186991 A1 Jun. 6, 2024

Related U.S. Application Data

(63) Continuation of application No. 17/931,864, filed on Sep. 13, 2022, now Pat. No. 11,923,855.

(60) Provisional application No. 63/246,213, filed on Sep. 20, 2021.

(51) Int. Cl.
H03K 3/00 (2006.01)
H03K 3/037 (2006.01)
H03K 3/13 (2006.01)
H03K 3/3565 (2006.01)

(52) U.S. Cl.
CPC .......... *H03K 3/0377* (2013.01); *H03K 3/037* (2013.01); *H03K 3/13* (2013.01); *H03K 3/3565* (2013.01)

(58) Field of Classification Search
CPC .......... H03K 19/20; H03K 3/037; H03K 3/13; H03K 3/0377
See application file for complete search history.

(56) References Cited

U.S. PATENT DOCUMENTS

| | | | |
|---|---|---|---|
| 6,288,599 B1* | 9/2001 | Coddington | H03K 19/018585 327/530 |
| 6,624,678 B1 | 9/2003 | Boutaud et al. | |
| 6,870,413 B1 | 3/2005 | Chang et al. | |
| 9,467,125 B2* | 10/2016 | Kumar | H03K 3/3565 |
| 9,654,086 B1 | 5/2017 | Fifield et al. | |
| 2016/0105183 A1 | 4/2016 | Kim | |
| 2021/0013873 A1 | 1/2021 | Chen et al. | |
| 2021/0159890 A1 | 5/2021 | Tercariol et al. | |
| 2022/0123738 A1 | 4/2022 | Gupta et al. | |

* cited by examiner

Primary Examiner — Tuan T Lam
(74) Attorney, Agent, or Firm — Seed Intellectual Property Law Group LLP

(57) ABSTRACT

An integrated circuit includes an input pad and a Schmitt trigger coupled to the input pad. The Schmitt trigger includes a first inverter and a second inverter. The Schmitt trigger includes a pull-up transistor coupled to an input of the second inverter and configure to supply a high reference voltage to the input of the second inverter.

16 Claims, 5 Drawing Sheets

SCHMITT TRIGGER WITH PULL-UP TRANSISTOR

BACKGROUND

Technical Field

The present disclosure is related to integrated circuits, and more particularly to integrated circuits including Schmitt triggers.

Description of the Related Art

Integrated circuits typically include a data input pad. The data input pad receives signals from a circuit external to the integrated circuit. The signals can include data signals that switch between low and high values corresponding to data values of 0 and 1.

In order to properly process the data signals that arrive at the input pad, integrated circuits typically include a driver circuit coupled to the input pad. The driver circuit receives the voltage at the input pad and outputs a data signal having a value corresponding to the data value of the input pad. The data signal output by the driver circuit can be either ground voltage (0) or a supply voltage (1) of the integrated circuit.

One example of an input driver circuit is a Schmitt trigger. The Schmitt trigger generally includes two inverters. The first inverter inverts the data signal from the pad. The second inverter inverts the output of the first inverter and, thus, provides an output corresponding to the data value at the pad, but at the supply voltage levels of the integrated circuit. The Schmitt trigger also includes circuitry that introduces a high threshold value and a low threshold value that help govern transitions between high and low and low and high values of the data signal at the pad. When transitioning from a low data value to a high data value, the output of the Schmitt trigger will not change from 0 to 1 unless the pad voltage exceeds the high threshold value. When transitioning from a high data value to a low data value, the output of the Schmitt trigger will not change from 1 to 0 unless the pad voltage is less than the low threshold value.

While the Schmitt trigger is a helpful input driver, there are also various difficulties associated with Schmitt triggers. For example, it can be difficult to design a Schmitt trigger with high switching speeds that can also operate at high supply voltages.

BRIEF SUMMARY

Embodiments of the present disclosure provide a Schmitt trigger that is able to operate effectively with high supply voltages while also protecting transistors of the Schmitt trigger from damage. The Schmitt trigger utilizes a feedforward connection to pull up a selected node of the Schmitt trigger to a reference value that is high enough to ensure proper operation of the Schmitt trigger and low enough to ensure that transistors of the Schmitt trigger are not damaged. The feedforward connection pulls up the selected node responsive to a voltage and an input of the Schmitt trigger.

The Schmitt trigger includes a first inverter and a second inverter. The Schmitt trigger includes a pass transistor implemented between the first and second inverters to ensure that a high supply voltage does not appear at an input of the second inverter. The Schmitt trigger includes a pull-up transistor that can pull up the input of the second inverter to a high reference voltage that is high enough to cause the second inverter to switch, but is low enough to ensure that the transistors of the second inverter are not damaged.

The result is a Schmitt trigger that can utilize relatively small transistors and relatively high supply voltages. The relatively small transistors enable high-frequency operation of the Schmitt trigger. The pass transistor and the pull-up transistor protect the relatively small transistors from damage when high supply voltages are used.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
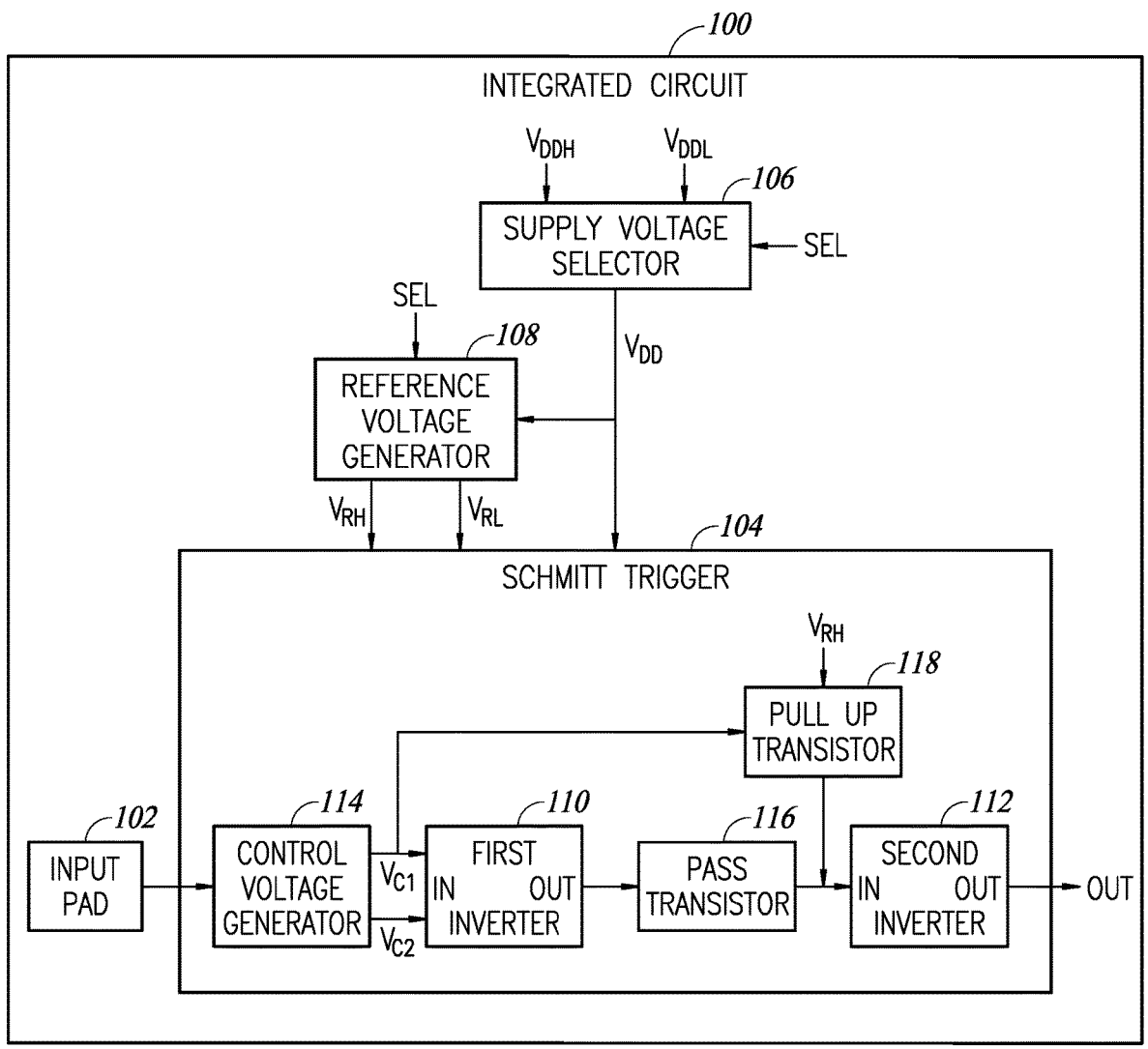
FIG. 1 is a block diagram of an integrated circuit including a Schmitt trigger, in accordance with some embodiments.

FIG. 1 is a block diagram of an integrated circuit 100, in accordance with some embodiments. The integrated circuit includes an input pad 102 and a Schmitt trigger 104. The Schmitt trigger 104 acts as an input driver for the input pad 102. As will be set forth in more detail below, the Schmitt trigger 104 provides high frequency operation while protecting the components of the Schmitt trigger 104.

The integrated circuit 100 may include a plurality of input pads. Each input pad corresponds to a terminal of the integrated circuit. The integrated circuit 100 may include a semiconductor die with a plurality of transistors, dielectric layers, and metal interconnect structures. In some embodiments, the pads may each include a conductive plate positioned on the top or bottom the integrated circuit die. When the integrated circuit 100 is encapsulated in a package, wire bonds, ball bonds, or other types of connectors may be coupled to the pads.

The input pad 102 is one of the pads of the integrated circuit 100. The input pad 102 corresponds to a data input terminal of the integrated circuit 100. The input pad receives data signals from an external device. The data signals are input voltage signals. The voltage value of the data signals indicates the data value associated with the data signals. A low input voltage value corresponds to a data value of 0. A high input voltage value corresponds to a data value 1.

The Schmitt trigger 104 acts as an input driver coupled to the input pad 102. The Schmitt trigger 104 receives the data signals at the input pad 102 and provides an output voltage representing the data value at the input pad 102 with either the high supply voltage VDD or ground voltage. When a data signal at the input pad 102 corresponds to a data value of 1, the Schmitt trigger 104 outputs the high supply voltage VDD corresponding to the data value of 1 at the input pad 102. When a data signal at the input pad corresponds to a data value of 0, the Schmitt trigger 104 outputs ground voltage corresponding to the data value of 0 at the input pad 102.

In some cases it may be beneficial to operate the Schmitt trigger 104 in a low voltage mode. In other cases it may be beneficial to operate the Schmitt trigger 104 in a high voltage mode. Accordingly, the integrated circuit 100 generates a high supply voltage VDDH and a low supply voltage VDDL. VDDH can be utilized as the supply voltage for the Schmitt trigger 104 in the high voltage mode. VDDL can be utilized as the supply voltage for the Schmitt trigger 104 in the low voltage mode.

In some embodiments, the high supply voltage VDDH has a value between 1.6 V and 2.1 V. The low supply voltage VDDL has a value between 1.0 V and 1.4 V. Other values can be utilized for the high supply voltage VDDH and the low supply voltage VDDL without departing from the scope of the present disclosure.

The integrated circuit 100 includes a supply voltage selector 106 coupled to the Schmitt trigger 104. The supply voltage selector 106 receives the high supply voltage VDDH and the low supply voltage VDDL. The supply voltage selector 106 also receives a selection signal SEL. The selection signal SEL indicates whether the Schmitt trigger 104 should be operated in the high voltage mode or the low voltage mode. When the selection signal SEL indicates that the Schmitt trigger should be operated in the high voltage mode, the supply voltage selector provides a supply voltage VDD having the value of VDDH. When the selection signal SEL indicates that the Schmitt trigger 104 should be operated in the low voltage mode, the supply voltage selector 106 provides a supply voltage VDD having the value of VDDL.

The integrated circuit 100 includes a reference voltage generator 108. The reference voltage generator 108 receives the supply voltage VDD from the supply voltage selector 106. The reference voltage generator outputs a high reference voltage VRH and a low reference voltage VRL based on the supply voltage VDD. The reference voltage generator 108 may also receive a selection signal SEL.

In some embodiments, in the high voltage mode the reference voltage generator 108 generates VRH by multi-plying the supply voltage VDD by a scaling value X that is less than one. The scaling value X may be between 0.6 and 0.7, though other values can be utilized without departing from the scope of the present disclosure. The reference voltage generator 108 may generate VRL by multiplying the supply voltage VDD by a scaling value Y. The scaling value Y may have a value between 0.3 and 0.4, though other values can be utilized without departing from the scope of the present disclosure. The scaling value Y may have a value equal to 1-X.

In some embodiments, in the low voltage mode the reference voltage generator 108 generates VRH equal to VDD. In the low voltage mode the reference voltage generator 108 may generate VRL equal to ground. Other values for VRH and VRL can be utilized in the low voltage mode without departing from the scope of the present disclosure.

The Schmitt trigger 104 includes a first inverter 110 and a second inverter 112. In a most basic operating concept, the first inverter 110 receives the input voltage from the input pad 102 and outputs the logical complement of the input voltage. For example, if the input voltage is high, then the first inverter 110 may output ground. If the input voltage is low, then the first inverter 110 may output the supply voltage VDD. The second inverter 112 receives the output of the first inverter and outputs the logical complement of the output of the first inverter 110. The output of the second inverter 112 is the output Out of the Schmitt trigger 104. In this way, the Schmitt trigger 104 outputs a data value corresponding to the data value at the input pad 102 by twice inverting the data value at the input pad 102.

The inverters 110 and 112 are made up of transistors. The transistors of the inverters 110 and 112 may be relatively small. Smaller transistors have smaller capacitances and can be turned on and off more quickly than larger transistors that have larger capacitances. Because the smaller transistors can be turned on and off more quickly, the Schmitt trigger 104 can operate at relatively high frequencies.

However, because the transistors of the Schmitt trigger 104 are relatively small, the transistors may have lower voltage ratings. As used herein, the term "voltage rating" of a transistor indicates the magnitude of voltage differences that may appear between any two of the terminals (e.g. gate, source, and drain) of the transistor without damaging the transistor. In the high voltage mode, the supply voltage VDD may be higher than the voltage rating of the transistors of the Schmitt trigger 104. Accordingly, if protective measures are not taken, then the transistors of the Schmitt trigger 104 may be damaged in the high voltage mode.

The Schmitt trigger 104 utilizes various components or configurations to protect the transistors of the first and second inverters 110 and 112 during the high voltage mode. The value of VRH is selected to be less than the voltage rating of the transistors of the Schmitt trigger 104. The second inverter 112 utilizes the high reference voltage VRH and ground as supply voltages to help ensure that voltages greater than the voltage rating of the transistors of the second inverter 112 do not appear across the terminals of the transistors of the second inverter 112. Nevertheless, without other precautions it is possible that VDD could appear at the input of the second inverter 112 via the output of the first inverter 110. For example, when the data value at the input pad 102 goes from 1 to 0, the voltage VDD may appear at the output of the first transistor 110.

In order to further protect the first inverter 110, the Schmitt trigger 104 includes a pass transistor 116 coupled between the first inverter 110 and the second inverter 112. The pass transistor has the effect of implementing a voltage drop between the output of the first inverter 110 and the input of the second inverter 112. When the output of the first inverter 110 is VDD, the voltage drop from the pass transistor 116 ensures that a voltage less than VDD appears at the input of the second inverter 112.

While utilizing the pass transistor 116 can protect the second inverter 112 in the high voltage mode, the pass transistor 116 can have a negative effect on the operation of the second inverter 112 in the low voltage mode. In the high voltage mode, VDD is sufficiently high that after the voltage drop of the pass transistor 116, the voltage at the input of the second inverter 112 may still be sufficiently high to cause the second inverter 112 to switch the output from high to low. However, in the low voltage mode VDD may be so small that after the voltage drop across the pass transistor 116, the voltage at the input of the second inverter 112 is not high enough to cause the second inverter 112 to switch from high to low.

In one example, VDD in the low voltage mode is about 1 V. The threshold voltage of the transistors of the second inverter 112 may be between about 0.7 V. The voltage drop across the pass transistor 116 may be about 0.7 V, leaving a voltage of about 0.3 V at the input of the second inverter 112. This voltage is insufficient to cause the transistors of the second inverter 112 to switch, thereby resulting in a failure of the second inverter 112 to switch to the low data value that has appeared at the input pad 102.

The Schmitt trigger 104 utilizes the control voltage generator 114 and the pull-up transistor 118 to ensure that the voltage at the input of the second inverter 112 is high enough to cause the second inverter 112 to switch states in the low voltage mode. The control voltage generator 114 is coupled between the input pad 102 and the first inverter 110. The control voltage generator 114 receives the input voltage from the input pad 102 and generates control signals VC1 and VC2. The control signals VC1 and VC2 operate as input signals of the first inverter 110. The control VC1 also controls operation of the pull-up transistor 118.

The control voltage generator 114 may receive the supply voltage VDD, the high reference voltage VRH, the low reference voltage VRL, and the input voltage. The control voltage generator 114 generates the control signals VC1 and VC2 based on the input voltage, VDD, the high reference voltage VRH, and the low reference voltage VRL.

The control signals VC1 and VC2 are applied to gate terminals of transistors of the first inverter 110. In the high voltage mode VC1 and VC2 have different values depending on the value of the input voltage. VC1 and VC2 are selected to ensure that the transistors of the first inverter 110 properly turn on and off and are protected from overvoltage.

The control signal VC1 is applied to the gate terminal of the pull-up transistor 118. In one embodiment, when the input voltage is low, the control signal VC1 is 0 V. When the input voltage is high, VC1 has the value of the high reference voltage VRH. Accordingly, when the input voltage is 0 V, the output of the inverter 110 is VDD. The control signal VC1 is fed forward to the gate terminal of the pull-up transistor 118. This causes the pull-up transistor 118 to turn on. When the pull-up transistor 118 is turned on, the high reference voltage is applied via the pull-up transistor 118 to the input of the second inverter 112. The result is that the input of the second inverter 112 is sufficiently high to cause the second inverter 112 to switch to provide ground voltage at the output Out.

This configuration is particularly beneficial in the low voltage mode in which, in the absence of the pull-up transistor 118, the input of the second inverter 112 may be too low to cause switching of the second inverter 112. Instead, due to the feedforward configuration of the control signal VC1 to the pull-up transistor 118, the pull-up transistor 118 is turned on and the high reference voltage VRH is supplied to the input of the second inverter 112.

The Schmitt trigger 104 of FIG. 1 can operate in both the high voltage mode and a low voltage mode. In the high voltage mode, the Schmitt trigger 104 receives the benefit of the voltage drop from the pass transistor 116. In the low voltage mode, the Schmitt trigger 104 receives the benefit of the feed forward configuration of the pull-up transistor 118 to ensure the voltage at the input of the second inverter 112 is sufficiently high to cause the second inverter 112 to switch when the input pad 102 goes low.

Figure 2:
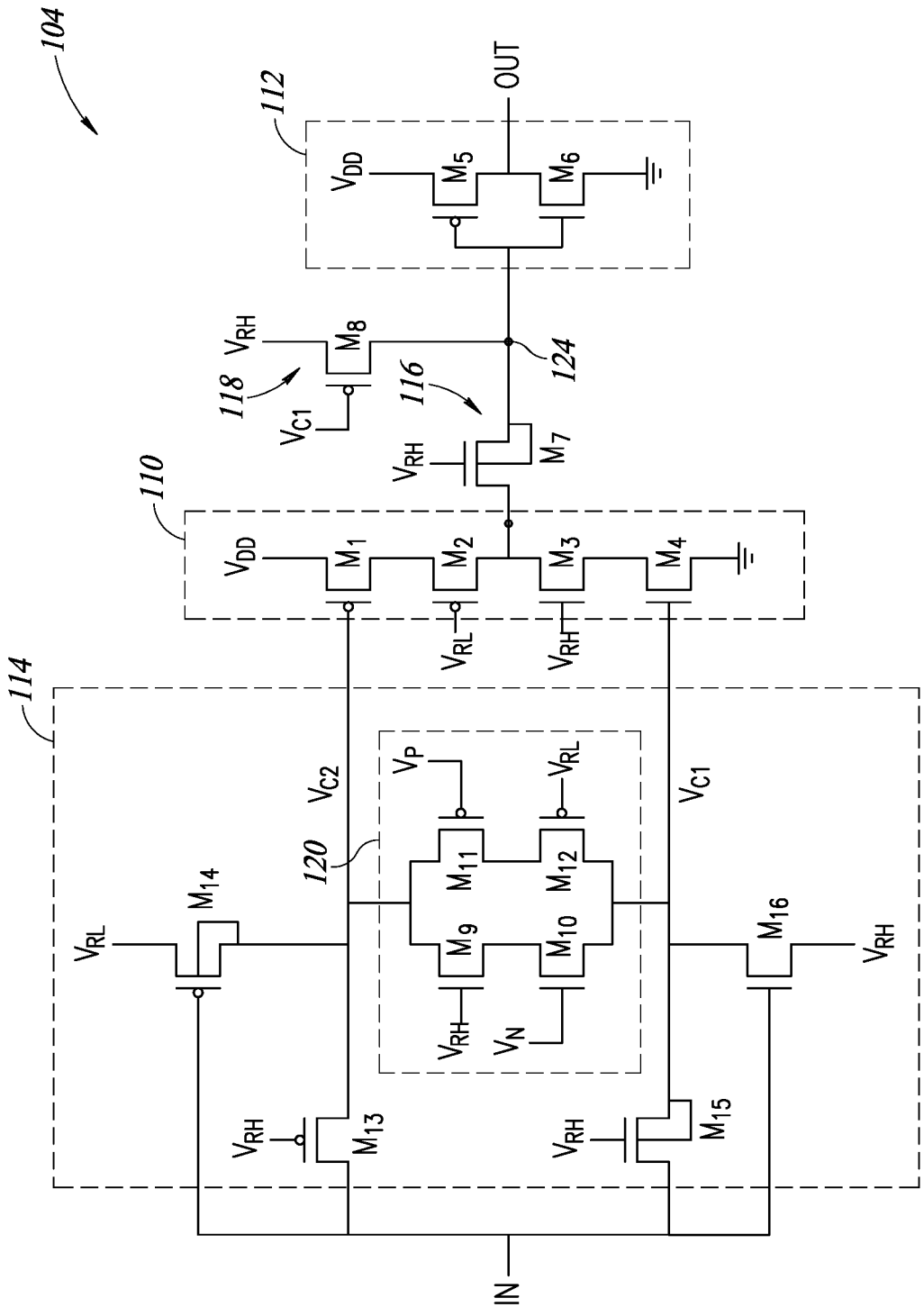
FIG. 2 is a schematic diagram of a Schmitt trigger, in accordance with some embodiments.

FIG. 2 is a schematic diagram of a Schmitt trigger 104, in accordance with some embodiments. The Schmitt trigger 104 of FIG. 2 is one example of a Schmitt trigger 104 of FIG. 1. The Schmitt trigger 104 includes an input In, a first inverter 110, a second inverter 112, and an output Out. The Schmitt trigger 104 also includes a control signal generator 114 between the input In and the first inverter 110. The input In may also be referred to as a main input of the Schmitt trigger. Thin output Out may also be referred to as a main output of the Schmitt trigger.

The first inverter 110 includes the PMOS transistor M1, the PMOS transistor M2, the NMOS transistor M3, and the NMOS transistor M4. The source terminal of the transistor M1 is coupled to the supply voltage VDD. The gate terminal of the transistor M1 receives the control signal VC2. The drain terminal of the transistor M1 is coupled to the source terminal of the transistor M2. The drain terminal of the transistor M2 receives the low reference voltage VRL. The drain terminal of the transistor M3 is coupled to the drain terminal of the transistor M2 at the node 122. The node 122 corresponds to the output of the first inverter 110. The gate terminal of the transistor M3 receives the high reference voltage VRH. The source terminal of the transistor M3 is coupled to the drain terminal of the transistor M4. The gate terminal of the transistor M4 receives the control signal VC1. The source terminal of the transistor M4 is coupled to ground.

The second inverter 112 includes a PMOS transistor M5 and an NMOS transistor M6. The PMOS transistor M5 has a source terminal coupled to the high reference voltage VRH. The gate terminal of the transistor M5 corresponds to the input of the second inverter 112. The drain terminal of the transistor M5 is coupled to the source terminal of the transistor M6 at the output Out of the second inverter 112 and the Schmitt trigger 104 overall. The gate terminal of the transistor M6 is coupled to the gate terminal of the transistor M5 and to the node 124. The node 124 corresponds to the input of the second inverter 112.

An NMOS transistor M7 is coupled between the output of the first inverter 110 and the input of the second inverter 112. The NMOS transistor M7 is a pass transistor 116. The source terminal of the pass transistor M7 is coupled to the node 124. The drain terminal of the pass transistor M7 is coupled to the output of the second inverter 110 at the node 122. The gate terminal of the transistor M7 receives the high reference voltage VRH.

A PMOS transistor M8 is coupled node 124. The PMOS transistor M8 is a pull-up transistor 118. The source terminal of the pull-up transistor M8 is coupled to the high reference voltage VRH. The gate terminal of the pull-up transistor M8 is coupled to the control signal VC1. The drain terminal of the transistor M8 is coupled to the node 124.

The basic operation of the Schmitt trigger 104, without yet going into detail of the control signal generator 114, is that the inverter 110 inverts the data value at the input In of the Schmitt trigger 104. If the input voltage at In represents a logical 0, then the transistors M1 and M2 will be turned on and the supply voltage VDD will be applied to the node 122. The transistors M3 and M4 are turned off when the input voltage In represents a logical 0. If the input voltage at In represents a logical 1, then the transistors M1 and M2 are turned off and the transistors M3 and M4 are turned on, thereby applying ground voltage to the node 122.

As described previously, the transistors of the inverters 110 and 112 may be relatively small and have correspondingly low voltage ratings in order to facilitate high-frequency operation. If the Schmitt trigger 104 is to be operated in the high voltage mode, as described in relation to FIG. 1, then it is beneficial to protect the transistors of the first and second inverters 110 and 112 from receiving the full supply voltage VDD between any of their terminals.

To ensure that the full supply voltage VDD does not appear at the input of the inverter 112 in the high voltage mode, the pass transistor M7 causes a voltage drop between the nodes 122 and 124. In particular, the source terminal (node 124) of the transistor M7 will have a voltage Vs=Vg−Vt, where Vs is the source voltage, Vg is the gate voltage, and Vt is the threshold voltage of the transistor M7. In an example in which the high reference voltage is 1.3 V and the threshold voltages 0.7 V, source voltage Vs is equal to about 0.6 V. While this adequately protects the transistors M5 and M6 of the inverter 112 from overvoltage situations, this also slows down the operation of the second inverter 112 and may not be sufficient to quickly cause the inverter 112 to switch its output to 0 V when the input In of the Schmitt trigger 104 goes low.

In the case of low voltage operation of the Schmitt trigger 104, the high reference voltage VRH may be about 1 V. This results in a source voltage Vs of about 0.3 V. This may not be adequate to cause the transistors M5 and M6 of the second inverter 112 to switch the output Out to 0 V when the input of the Schmitt trigger 104 goes low.

In order to ensure rapid and stable switching of the inverter 112 when the input In of the Schmitt trigger 104 goes low, the Schmitt trigger 104 utilizes the pull-up transistor 118. The pull-up transistor 118 receives the control signal VC1 in a feedforward manner from the control signal generator 114. The control signal generator 114 generates the control signal VC1 based on the input voltage at the input In of the Schmitt trigger 104. In particular, when the input voltage In is high, the control signal VC1 has the value of the high voltage reference VRH. When the input In is low, the control signal VC1 has the value of ground.

When the input In goes low, the control signal VC1 has a value of 0 V, thereby turning on the transistor M8. When the transistor M8 is turned on, the high voltage reference VRH is applied to the node 124. This is described as a feedforward pull up operation because the control signal VC1 is fed forward from the control signal generator 114 upstream from the pass transistor M7. Because the control signal VC1 is fed forward and is independent of the voltage at the node 124, the pull-up transistor M8 can be quickly and reliably enabled to provide the high reference voltage to the node 124. When the high reference voltage is applied to the node 124, the second inverter 112 quickly switches the output Out from VRH to ground.

The feedforward configuration of the pull-up transistor M8 causes rapid and reliable switching of the node 124 to the value of the high reference voltage VRH in either the high voltage mode or the low voltage mode. When the input voltage In goes high, VC1 also goes to the high reference voltage VRH, thereby turning off the pull-up transistor M8. In this case, the node 124 quickly goes to ground voltage via the pass transistor 116 and the transistors M3 and M4 of the first inverter 110, in either the high voltage mode or the low voltage mode.

The control signal generator 114 includes a switch 120. The switch 120 includes the NMOS transistors M9 and M10 and the PMOS transistors M11 and M12. The drain terminal of the transistor M9 is coupled to the gate terminal of the transistor M1. The gate terminal of the transistor M9 receives the high reference voltage VRH. The source terminal of the transistor M9 is coupled to the drain terminal of the transistor M10. The gate terminal of the transistor M10 receives the signal Vn. The source terminal of the transistor M10 is coupled to the gate terminal of the transistor M4. The source terminal of the transistor M11 is coupled to the source terminal of the transistor M9 and the gate terminal of the transistor M1. The gate terminal of the transistor M11 receives the signal VP. The drain terminal of the transistor M11 is coupled to the source terminal of the transistor M12. The gate terminal of the transistor M12 receives the low reference voltage VRL. The drain terminal of the transistor M12 is coupled to the source terminal of the transistor M10 and the gate terminal of the transistor M4.

The value of the signals VP and VN are dependent on whether the high voltage mode or the low voltage mode is selected. In the high voltage mode VP is equal to VDD and VN is equal to ground. In the low voltage mode VP is equal to the low reference voltage VRL and the signal VN is equal to the high reference voltage VRH.

In the high voltage mode, the switch 120 is effectively open. This is because the control signals VP and VN disable the transistors and malevolent M10. In the low voltage mode, the switch 120 is closed because all of the transistors M9, M10, M11, and M12 are enabled, thereby effectively coupling the gate terminals of the transistors M1 and M4 together.

The Schmitt trigger 104 also includes PMOS transistors M13 and M14 and NMOS transistors M15 and M16. The source terminal of the transistor M13 is coupled to the gate terminal of the transistor M1. The gate terminal of the transistor M13 receives the low reference voltage VRL. The drain terminal of the transistor M13 is coupled to the input In of the Schmitt trigger 104. The source terminal of the transistor M14 is coupled to the low reference voltage VRL. The gate terminal of the transistor M14 is coupled to the input In of the Schmitt trigger 104. The gate drain terminal of the transistor M14 is coupled to the drain terminal of the transistor M13 and the gate terminal of the transistor M1. The drain terminal of the transistor M15 is coupled to the input In of the Schmitt trigger 104. The gate terminal of the transistor M15 receives the high reference voltage VRH. The source terminal of the transistor M15 is coupled to the gate terminal of the transistor M4. The source terminal of the transistor M16 is coupled to the high reference voltage VRH. The gate terminal of the transistor M16 is coupled to the input In of the Schmitt trigger 104. The drain terminal of the transistor M16 is coupled to the gate terminal of the transistor M4.

The control signals VC1 and VC2 are generated based on the state of the switch 120 and the value of the input voltage. In the high voltage mode, if the input voltage In is ground, then transistor M16 is off and the transistor M15 is on, thereby coupling the gate terminal of the transistor M4 to the input In at ground via the transistor M15. Accordingly, the control signal VC1 is ground in the high voltage mode when the input In is ground. With the input In at ground, M14 is turned on, thereby coupling the gate terminal of the transistor M1 to the low reference voltage VRL. The switch 120 is open in the high voltage mode, so the control signals VC1 and VC2 are isolated from each other.

When In goes high in the high voltage mode, the transistor M16 is turned on, thereby coupling the gate terminal of the transistor M4 to VRH through the enabled transistor M16. Thus, the control signal VC1 has the value of the high reference voltage VRH. In this situation, the transistor M13 is turned on and the transistor M14 is turned off. With the transistor M13 turned on, the high voltage at the input In is applied to the gate terminal of the transistor M1. Accordingly the control signal VC2 has the high value of the input terminal In.

In the low voltage mode, when the input In is at ground, the transistor M15 is turned on and the transistor M16 is turned off, thereby coupling the gate terminal transistor M4 to the ground input terminal In via the transistor M15. The transistors M13 and M14 are off. The switch 120 is closed, thereby coupling the gate terminal of the transistor M1 to ground via the switch M15. Accordingly, the control signals VC1 and VC2 are both ground.

In the low voltage mode, when the input In is high, the transistor M15 is off and the transistor M16 is on, thereby coupling the gate terminal of the transistor M4 to the high reference voltage VRH via the transistor M16. The transistors M13 and M14 are off. Because the switch 120 is closed in the low voltage mode, the gate terminal of the transistor M1 is coupled to the high reference voltage VRH via the transistor M16. Accordingly, the control signals VC1 and VC2 are both at the value of the high reference voltage VRH.

In the high voltage mode, when the input voltage is high, VC2 is high, thereby turning off the transistor M1. VC1 has the value of the high reference voltage VRH, thereby turning on the transistor M4. The transistors M2 and M3 are always on. Accordingly, the node 122 is coupled to ground via the transistors M3 and M4.

In the high voltage mode, when the input voltage is low, the control signal VC2 has the value of the low reference voltage VRL, thereby turning on the transistor M1. The control signal VC1 has a value of ground, thereby turning off the transistor M4. Accordingly, the node 122 is coupled to the supply voltage VDD via the transistors M1 and M2.

In the low voltage mode, when the input voltage is high, the control signal VC2 has the value of VRH, thereby turning off the transistor M1. VC1 has the value of the high reference voltage VRH, thereby turning on the transistor M4. Accordingly, the node 122 is coupled to ground via the transistors M3 and M4.

In the low voltage mode, when the input voltage is low, the control signal VC2 has the value ground, thereby turning on the transistor M1. VC1 has the value of ground, thereby turning off the transistor M4. Accordingly, the node 122 is coupled to VDD via the transistors M1 and M2.

Figure 3:
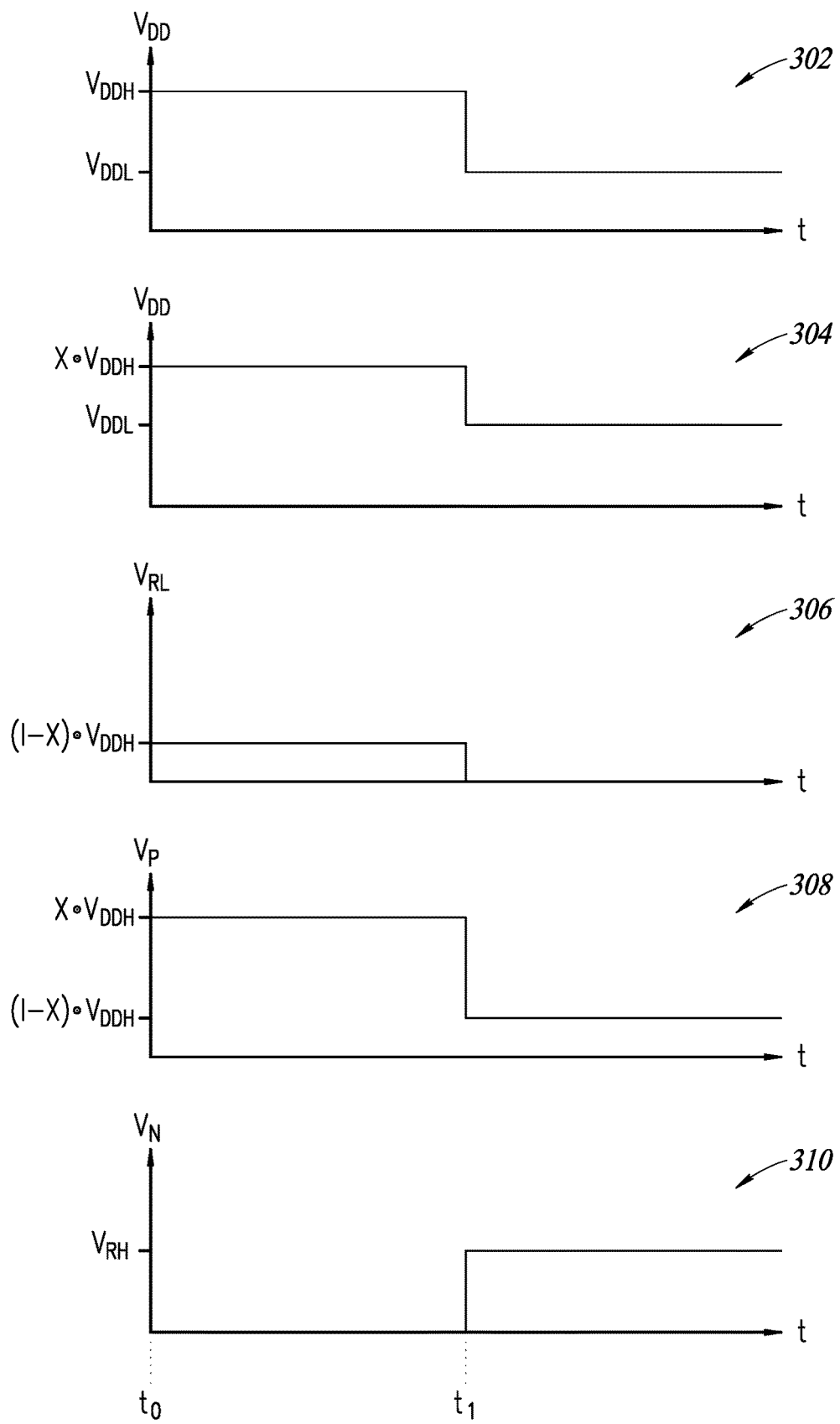
FIG. 3 includes a plurality of graphs of voltages associated with a Schmitt trigger, in accordance with some embodiments.

FIG. 3 includes a plurality of graphs 302-310 representing voltage signals associated with the Schmitt trigger 104 of FIGS. 1 and 2 that do not change based on the input voltage at the input In of the Schmitt trigger 104, but rather depend on the value of the selection signal SEL. Between times t0 and t1 the selection signal SEL selects the high voltage mode. After the time t1, the selection signal SEL selects the low voltage mode. The signals associated with the graphs 302-310 can have other values and characteristics than those shown in FIG. 3 without departing from the scope of the present disclosure.

The graph 302 represents the supply voltage VDD. During the high voltage mode between times t0 and t1, the supply voltage VDD has a value of the high supply voltage VDDH, as described in relation to FIG. 1. During the low voltage mode after time t1, the supply voltage VDD has the value of the low supply voltage VDDL, as described in relation to FIG. 1.

The graph 304 represents the high reference voltage VRH. During the high voltage mode between times t0 and t1, the high reference voltage VRH has the value of the scaling factor X multiplied by VDDH. During the low voltage mode after time t1, the high reference voltage VRH has the value of the low supply voltage VDDL.

The graph 306 represents the low reference voltage VRL. During the high voltage mode between times t0 and t1, the low reference voltage VRL has the value of $(1-X)*VDDH$. During the low voltage mode after time t1, the low reference voltage VRL has the value of ground.

The graph 308 represents the signal VP. During the high voltage mode between times t0 and t1 the signal VP has a value of VDDH. During the low voltage mode after time t1 the signal VP has the value of the low reference voltage VRL during the same period of time.

The graph 310 represents the signal VN. During the high voltage mode between times t0 and t1, the signal VN has a value of ground. During the low voltage mode after time t1, the signal VN has the value of the high reference voltage during the same period of time.

Figure 4:
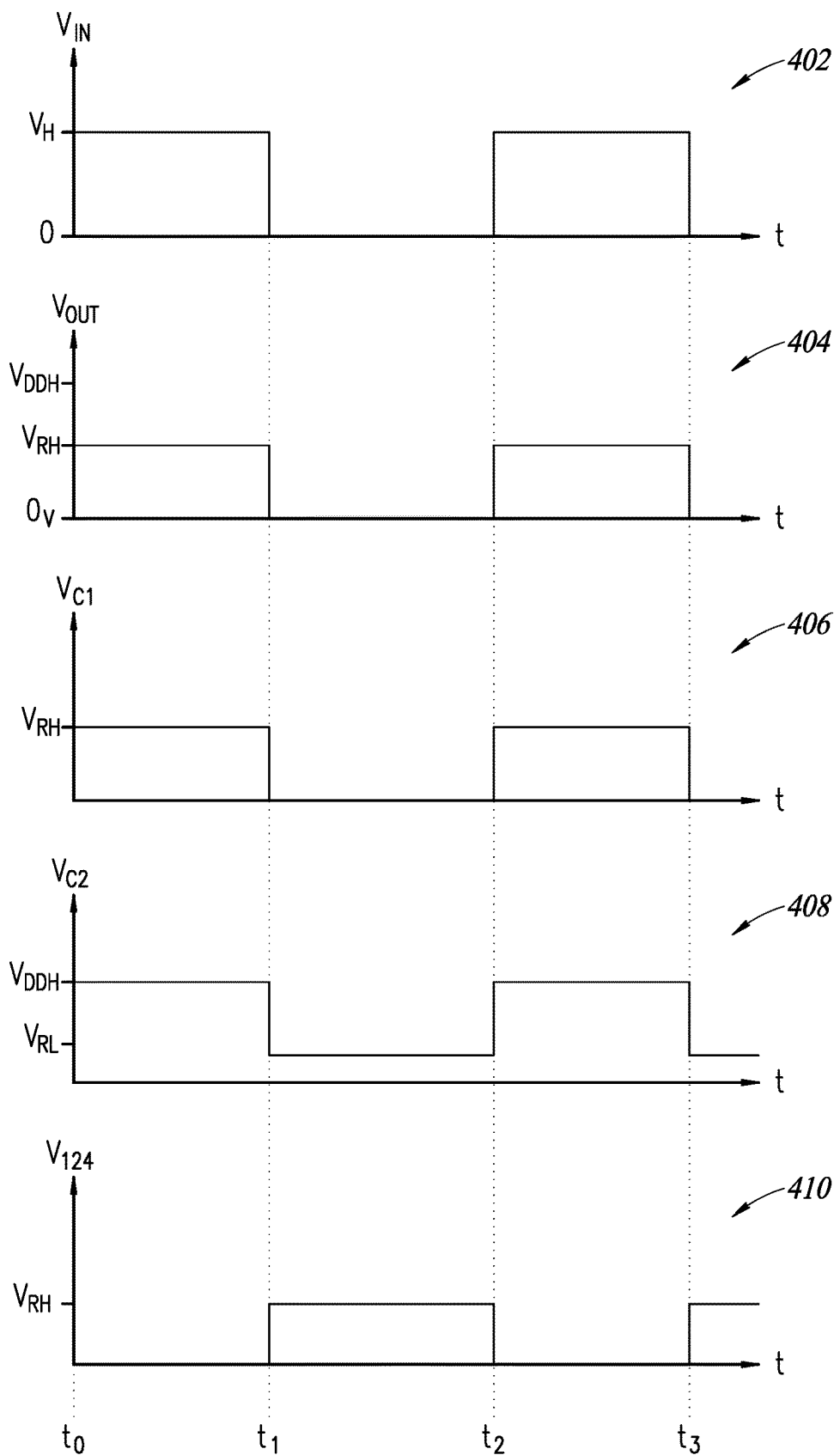
FIG. 4 includes a plurality of graphs of voltages associated with a Schmitt trigger, in accordance with some embodiments.

FIG. 4 includes a plurality of graphs 402-410 representing voltage signals associated with the Schmitt trigger 104 of FIGS. 1 and 2 that change based on the input voltage at the input End of the Schmitt trigger 104. While FIG. 4 illustrates several signals transitioning at the same time, in practice, there may be slight delays between some transitions. FIG. 4 illustrates the signals during the high voltage mode. The graphs 402-410 can have other values and characteristics than shown in FIG. 4 without departing from the scope of the present disclosure.

The graph 402 represents the input voltage VIN at the input In of the Schmitt trigger 104. Between times t0 and t1 and between times t2 and t3, VIN is high and has the value of the high input voltage VH. Between times t1 and t2, VIN is low and has the value of ground.

The graph 404 represents the output voltage V out at the output Out of the Schmitt trigger 104. Between times t0 and t1 and between times t2 and t3, the out is high and has a value of the high reference voltage VRH. Between times t1 and t2, the output is low and has the value of ground.

The graph 406 represents the control signal VC1. Between the times t0 and t1 and between the times t2 and t3, the control signal VC1 is high and has the value of the high reference voltage VRH. Between times t1 and t2, the control signal VC1 is low and has a value of ground.

The graph 408 represents the control signal VC2. Between times t0 and t1 and between times t2 and t3, the control signal VC2 is high and has the value of the high supply voltage VDDH. Between times t1 and t2, VRL is low and has the value of the low reference voltage VRL. During the low voltage mode the control signal VC2 has the value of VDDL when high and the value of ground when low.

The graph 410 represents the voltage V124 at the node 124. Between times t0 and t1 and between times t2 and t3, V124 is low and has the value of ground. Between times t1 and t2 V124 is high and has a value of the high reference voltage VRH.

Figure 5:
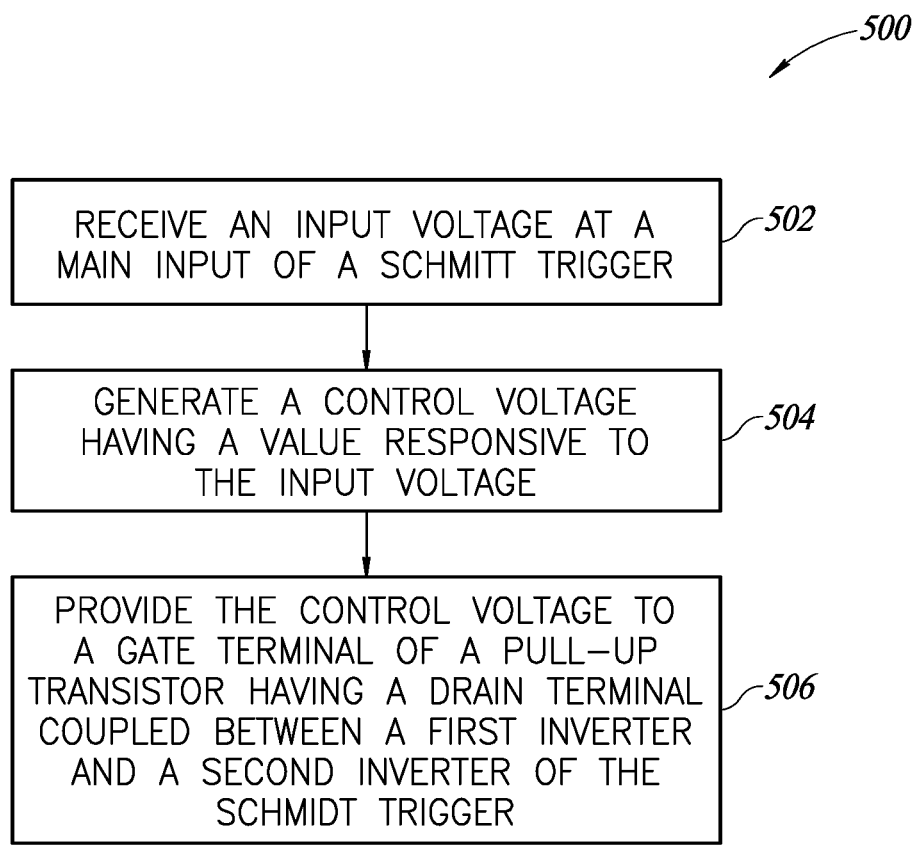
FIG. 5 is a flow diagram of a method for operating a Schmitt trigger, in accordance with some embodiments.

FIG. 5 is a flow diagram of a method 500 for operating a Schmitt trigger, in accordance with some embodiments. The method 500 can utilize systems, components, and processes described in relation to FIGS. 1-4. At 502, the method 500 includes receiving an input voltage at a main input of a Schmitt trigger. At 504, the method 500 includes generating a control voltage having a value responsive to the input voltage. At 506, the method 500 includes providing the control voltage to a gate terminal of a pull-up transistor having a drain terminal coupled between the first inverter and a second inverter of the Schmitt trigger.

In some embodiments, an integrated circuit includes a Schmitt trigger. The Schmitt trigger includes a main input, a main output, and a first inverter coupled to the main input. The Schmitt trigger includes a second inverter coupled between the first inverter and the main output, a pass transistor coupled between the first inverter and the second inverter and a pull-up transistor having a drain terminal coupled between the pass transistor and the second inverter.

In some embodiments, a method includes receiving an input voltage at a main input of a Schmitt trigger, generating a control signal having a value based on the input voltage, and providing the control signal to a gate terminal of a pull-up transistor having a drain terminal coupled between a first inverter and a second inverter of the Schmitt trigger.

In some embodiments, an integrated circuit includes a supply voltage selector configured to receive a selection signal and to output a supply either a high supply voltage or a low supply voltage as a supply voltage responsive to the selection signal. The integrated circuit includes a reference voltage generator configured to generate a reference voltage based on the supply voltage and a Schmitt trigger configured to receive the supply voltage, the reference voltage, and an input voltage. The Schmitt trigger includes a main input, a first inverter, and a second inverter coupled to the first inverter. The Schmitt trigger includes a control signal generator coupled between the input and the first inverter and configured to generate a control signal based on the input voltage and a pull-up transistor having a first terminal coupled to an input of the second inverter and a second terminal configured to receive the control signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
  receiving, at a main input of Schmitt trigger, an input voltage;
  receiving, with a reference voltage generator, a supply voltage;
  generating, with the reference voltage generator, a high reference voltage based on the supply voltage and lower than the supply voltage;
  generating, with a control signal generator coupled between the main input and a first inverter of the Schmitt trigger, a control signal having a value based on the input voltage; and
  providing the control signal to a control terminal of a pull-up transistor of the Schmitt trigger, wherein the pullup transistor is coupled between the first inverter of the Schmitt trigger and a second inverter of the Schmitt trigger and has a source terminal coupled to the high reference voltage, wherein the first and second inverters are coupled between the supply voltage and ground, wherein the control signal is equal to the high reference voltage when the input voltage is high, wherein the control signal is ground when the input voltage is low.

2. The method of claim 1, wherein a pass transistor is coupled between the first inverter and a second inverter of the Schmitt trigger.

3. The method of claim 2, wherein a drain terminal of the pull-up transistor is coupled between the pass transistor and the second inverter.

4. The method of claim 1, wherein a gate terminal of the pull-up transistor receives the control signal.

5. The method of claim 4, wherein the control signal is equal to the high reference voltage when the input voltage is high, wherein the control signal is 0 V when the input voltage is low.

6. The method of claim 5, comprising providing the high reference voltage from the pull-up transistor to an input of the second inverter when the input voltage is low.

7. The method of claim 6, wherein a source terminal of the pull-up transistor is coupled to the high reference voltage.

8. The method of claim 2, further comprising providing, with a supply voltage selector, either a low supply voltage or a high supply voltage as the supply voltage based on a mode selection value.

9. The method of claim 8, comprising generating, with the reference voltage generator, the high reference voltage based on the supply voltage and the mode selection value.

10. A method, comprising:
  receiving, with a supply voltage selector of an integrated circuit, a selection signal;
  outputting, with the supply voltage selector, and either a high supply voltage or a low supply voltage as a supply voltage responsive to the selection signal;
  generating, with a reference voltage generator, a reference voltage based on the supply voltage and lower than the supply voltage; and
  receiving, with a Schmitt trigger of the integrated circuit, the reference voltage and an input voltage; and
  generating, with a control signal generator of the Schmitt trigger, a control signal based on the input voltage; and
  providing the control signal to a gate terminal of a pull-up transistor having a source terminal receiving the reference voltage and a drain terminal coupled to an output of a first inverter of the Schmitt trigger and an input of a second inverter of the Schmitt trigger, wherein the first and second inverters are coupled between the supply voltage and ground.

11. The method of claim 10, comprising providing the reference voltage from the pull-up transistor to the input of the second inverter.

12. The method of claim 10, wherein the control signal is equal to the high reference voltage when the input voltage is high, wherein the control signal is 0 V when the input voltage is low.

13. The method of claim 12, comprising providing the high reference voltage from the pull-up transistor to an input of the second inverter when the input voltage is low.

14. A method, comprising:
  receiving, with a reference voltage generator, a supply voltage;

generating, with the reference voltage generator, a high reference voltage lower than the supply voltage;

receiving an input value at a main input of Schmitt trigger that includes a first inverter coupled to the main input, a second inverter coupled to the first inverter, and a main output coupled to the second inverter, the first and second inverters each being coupled between a supply voltage and ground;

generating a feed-forward control signal based on the input value, wherein the feed-forward control signal is equal to the high reference voltage when the input voltage is high, wherein the control signal is 0 V when the input voltage is low; and providing the feed-forward control signal to a gate terminal of PMOS pull-up transistor having a drain terminal coupled to an input of the second inverter and a source terminal coupled to the high reference voltage.

15. The method of claim 14, comprising:

supplying the high reference voltage to a source terminal of the pull-up transistor.

16. The method of claim 15, wherein a pass transistor is coupled between an output of the first inverter and the input of the second inverter.

\* \* \* \* \*